United States Patent [19]
Yano

[11] Patent Number: 5,380,806
[45] Date of Patent: Jan. 10, 1995

[54] INK COMPOSITION COMPRISING A POLYURETHANE AND A MIXTURE OF EPOXIDES

[75] Inventor: Hitoshi Yano, Chiba, Japan

[73] Assignee: Chisso Corporation, Osaka, Japan

[21] Appl. No.: 227,989

[22] Filed: Apr. 15, 1994

Related U.S. Application Data

[63] Continuation of Ser. No. 875,825, Apr. 30, 1992, abandoned.

[30] Foreign Application Priority Data

May 2, 1991 [JP] Japan .................. 3-128225

[51] Int. Cl.$^6$ .......................................... C08F 283/00
[52] U.S. Cl. ........................... 525/481; 525/496; 525/500; 525/510; 525/524; 525/528
[58] Field of Search ............... 525/481, 496, 500, 510, 525/524, 528

[56] References Cited

U.S. PATENT DOCUMENTS

| | | | |
|---|---|---|---|
| H304 | 7/1987 | Vorrier et al. | 525/920 |
| 3,971,745 | 7/1976 | Carlson et al. | 525/528 |
| 4,036,906 | 7/1977 | Finelli | 525/454 |
| 4,045,474 | 8/1977 | Taller et al. | 260/484 |
| 4,160,065 | 7/1979 | Loewrigkeit et al. | 525/454 |
| 4,261,871 | 4/1981 | Smith et al. | 528/110 |
| 4,447,591 | 5/1984 | Watanabe et al. | 528/80 |
| 4,725,653 | 2/1988 | Koleske | 525/510 |
| 4,738,989 | 4/1988 | Smith | 521/107 |
| 4,749,743 | 6/1988 | Ambrose et al. | 525/123 |
| 4,808,658 | 2/1989 | Walz et al. | 528/73 |
| 4,842,938 | 6/1989 | Rizk et al. | 525/454 |
| 4,853,423 | 8/1989 | Walles et al. | 525/396 |
| 4,873,307 | 10/1989 | Frederici et al. | 525/453 |
| 4,925,885 | 5/1990 | Rosthauser et al. | 523/415 |
| 5,112,888 | 5/1992 | Ueji et al. | 525/482 |
| 5,143,950 | 9/1992 | Kitagawa et al. | 525/485 |

FOREIGN PATENT DOCUMENTS

| | | |
|---|---|---|
| 56-141328 | 11/1981 | Japan . |
| 60-188482 | 9/1985 | Japan . |
| 61-95018 | 5/1986 | Japan . |
| 02212567 | 8/1990 | Japan . |
| 63-89673 | 10/1990 | Japan . |
| 02-255714 | 10/1990 | Japan . |

OTHER PUBLICATIONS

Derwent Publications Ltd., London, GB; Class A, AN 92-109236 corresponding to JP-A-4 050 271 (Chisso Corp), 19 Feb. 1992.

*Primary Examiner*—Melvyn I. Marquis
*Assistant Examiner*—Randy Gulakowski
*Attorney, Agent, or Firm*—Leydig, Voit & Mayer

[57] ABSTRACT

The present invention provides an ink composition for printing which comprises a blend of 100 parts by weight of a copolymer comprising a polycaprolactonepolyol, a diamine and a diisocyanate, 30 to 300 parts by weight of a novolac type epoxy resin, 30 to 300 parts by weight of a bisphenol type epoxy resin, 0.2 to 20 parts by weight of a thixotropic agent, 0.1 to 30 parts by weight of a defoaming agent, and 0.1 to 10 parts by weight of a leveling agent. This ink composition is excellent in storage stability, heat resistance, adhesive properties, flexibility, electrical properties, chemical resistance and printing properties as a one-pack type ink composition.

14 Claims, No Drawings

INK COMPOSITION COMPRISING A POLYURETHANE AND A MIXTURE OF EPOXIDES

This application is a continuation of application Ser. No. 07/875,825, filed Apr. 30, 1992 now abandon.

BACKGROUND OF THE INVENTION (i) Field of the Invention

The present invention relates to an ink composition for printing which can be used to cover circuit boards, and particularly it relates to an ink composition for printing which has improved printability, adhesive properties, flexibility and heat resistance.

(ii) Description of the Related Art

Heretofore, cover films have been used as covering base materials for printing circuits. With regard to the usage of these cover films, either surface of each polyimide film or polyester film is first coated with an adhesive, and the film is punched at the position thereof corresponding to a terminal connection site in a manner such as punching. Afterward, this film is positioned on a circuit board by hand and then stuck thereon at a high temperature under a high pressure by means of a device such as a heat plate press.

This process is excellent in flexibility and is advantageous from the viewpoint of a circuit protection, but it has some problems. For example, when the terminal of a distribution frame is led, the cover film is required to be punched previously, thereby perforating a small hole through the cover film. Therefore, when the circuit is complex, the positioning of the film to the distribution frame is difficult. In addition, facilities such as the hot plate press are expensive. Furthermore, since adhesive is used, when punching is missed this tends to occur in the punching step, which increases the cost. In addition, the adhesive is likely to ooze when the film is pressed.

Moreover, even if the physical properties of the film itself are good, the performance of the whole cover film depends unavoidably upon the level of the adhesive, so long as adhesive is used, because the quality itself of the adhesive is still unsatisfactory, and any adhesive so good as to be comparable to the base film in points of heat resistance and electrical characteristics has not been found so far.

A method (cover lay ink) for forming insulating protective films on print-circuit boards by a printing process has been developed. However, the cover layer ink agent presently being used applies solder resists which has been heretofore used for rigid boards. This cover layer ink is poor in flexibility, heat resistance, electrical properties and adhesive properties to the base material, and when the cover layer ink is applied to flexible print circuit boards (hereinafter abbreviated to "FPC"), there is the problem that curling takes place owing to a difference between thermal expansion coefficients of the cover layer ink and the boards, and owing to curing shrinkage. In addition, the reaction rate of the cover layer ink with a resin is slow, and therefore most of the cover layer inks are of a twopack type. For this reason, the handling of the cover layer ink is troublesome, and after the two liquids are mixed, a pot life is short and a storage stability is poor.

For example, Japanese Patent Application Laid-open No. 55-145717 discloses a composition comprising an epoxy acrylate resin and a melamine resin, but this composition has the drawback that the flexibility is poor.

Furthermore, Japanese Patent Publication Nos. 50-4395 and 53-10636 disclose acrylic resin compositions such as sulmephomethylene acrylate and ethylene phosphate acrylate, and all of them are excellent in flexibility but poor in heat resistance.

Japanese Patent Application Laid-open No. 63-221172 discloses a resin composition mainly comprising a polyaminobismaleimide and an epoxy resin, and Japanese Patent Application Laid-open No. 1-121364 discloses a composition containing a polyimide as the main component, and Japanese Patent Application Laid-open No. 1-256515 discloses a composition mainly comprising a polyparabanic acid and an epoxy resin. These compositions noticeably shrink at the time of curing and there is a large difference between the thermal expansion coefficients of the cured resin composition and the board, and for these reasons, the FPC boards on which the cover layer coating is formed curl noticeably.

In Japanese Patent Application Laid-open No. 2-283762, a composition mainly comprising a polyimide and a low-elastic resin is disclosed, and the FPC board scarcely curls on which the cover layer film of such a composition is formed. In this composition, however, there is used the polyimide resin which scarcely has such physical properties as to withstand its practice, if it does not have a substantially high molecular weight, and therefore its solid content concentration inevitably remains at a low level. Accordingly, in order to obtain the cover layer film having a practically necessary thickness, it is essential to carry out the printing many times, which makes production efficiency low. This is a serious bottleneck in the process. Furthermore, for the curing, the conditions of extremely high temperature are required, and so a conductive foil of the board is likely to be oxidized in the curing step. For the achievement of the curing at a high temperature, a specific curing furnace and the like are necessary, so that the cost increases.

SUMMARY OF THE INVENTION

Objects of the present invention are to solve the above-mentioned problems and to provide an ink composition for printing which is used to cover circuit boards and which can improve storage stability, printability, electrical properties, chemical resistance, flexibility, heat resistance and the inhibition of curling when it is applied to FPC boards.

The first aspect of the present invention is directed to an ink composition for printing which comprises a blend of 100 parts by weight of a copolymer of a polycaprolactonepolyol, a diamine and a diisocyanate, about 30 to about 300 parts by weight, preferably about 40 to about 150 parts by weight, preferably resin, about 30 to about 300 parts by weight, preferably about 40 to about 150 parts by weight of a bisphenol type epoxy resin, about 0.2 to 20 parts by weight, preferably about 0.5 to about 15 parts by weight of a thixotropic agent, about 0.1 to about 30 parts by weight, preferably about 0.5 to about 20 parts by weight of a defoaming agent, and about 0.1 to about 10 parts by weight of a leveling agent.

The second aspect of the present invention is directed to an ink composition for printing described in the first aspect wherein the copolymer comprising the polycaprolactonepolyol, the diamine and the diisocyanate is a copolymer obtained by polymerizing about 20 to about 80 parts by weight, preferably about 30 to about 80 parts of the polycaprolactonepolyol, about 10 to about 40 parts by weight, preferably about 15 to about 35 parts by weight of the diamine, and about 10 to about 40 parts by weight, preferably about 15 to about 35 parts by weight of the diisocyanate.

The third aspect of the present invention is directed to an ink composition for printing described in the first aspect wherein the epoxy resin is blended in an amount of about 10 to about 1,000 parts by weight, preferably about 30 to about 500 parts by weight with respect to 100 parts by weight of the copolymer comprising the polycaprolactonepolyol, the diamine and the diisocyanate.

The fourth aspect of the present invention is directed to an ink composition for printing described in the first aspect wherein the bisphenol type epoxy resin is blended in an amount of about 12.5 to about 5,000 parts by weight, preferably about 17 to about 2,500 parts by weight with respect to 100 parts by weight of the novolac type epoxy resin.

The fifth aspect of the present invention is directed to an ink composition for printing described in the first aspect wherein an epoxy equivalent of the bisphenol type epoxy resin is in the range of about 1,000 to about 10,000.

In the above-mentioned ink composition, an organic solvent and a curing catalyst for the epoxy resin may be contained.

DETAILED DESCRIPTION OF THE PREFERRED EMBODIMENTS

With regard to a polycaprolactonepolyol (hereinafter abbreviated to "PC") which is one raw material of a copolymer comprising a polycaprolactonepolyol, a diamine and a diisocyanate that is used in the present invention, no particular restriction is put on its molecular weight and the number of its terminal hydrogen groups, and a commercially available product can be directly used. Examples of the PC include Placcel (trade mark made by Union Carbide Co. Ltd.) and NIAX PCP (trade mark made by Daisell Ltd.).

Furthermore, examples of the diamine include carbocyclic aromatic diamines, heterocyclic diamines, alicyclic diamines, alicyclic diamines and aromatic aliphatic diamines.

Examples of the carbocyclic aromatic diamines include 1,4-phenylenediamine, 1,3-phenylenediamine, 4,4'-diamino diphenyl ether, 4,4'-diaminodiphenylmethane and 4,4'-diaminodiphenylsulfone.

Examples of the heterocyclic diamines include 2,6-diaminopyridine, 2,4-diaminopyridine and 2,4-diaminostriazine.

Examples of the aliphatic diamine include dimethylenediamine, hexamethylenediamine and 2,2-dimethylpropylenediamine.

Examples of the alicyclic diamines include 1,4-diaminocyclohexane and 4,4'-diaminodicyclohexylmethane.

Examples of the aromatic aliphatic diamines include 1,3-bis(aminomethylbenzene) and 1,4-bis(aminomethylbenzene).

These diamines can be used singly or in combination.

Examples of the diisocyanate include 2,4-tolylene diisocyanate, 2,6-tolylene diisocyanate, diphenylmethane diisocyanate, hexamethylene diisocyanate, isophorone diisocyanate and cyclohexane diisocyanate.

As a preparation method of the above-mentioned copolymer, there can be employed a known process such as a solution polymerization or an emulsion polymerization.

With regard to the ratio of the PC, the diamine and the diisocyanate which are used in the preparation of the above-mentioned copolymer, the amount of the PC is from about 20 to about 80 parts by weight, preferably from about 30 to about 80 parts by weight, the amount of the diamine is from about 10 to about 40 parts by weight, preferably about 15 to about 35 parts by weight, and the amount of the diisocyanate is from about 10 to about 40 parts by weight, preferably from about 15 to about 35 parts by weight. When the amount of the PC is in excess of the above-mentioned composition ratio and more than about 80 parts by weight, curing properties and the like are liable to deteriorate, and conversely when it is less than about 20 parts by weight, flexibility and the like are liable to be impaired. When the amount of the diamine is in excess of the above-mentioned composition ratio and more than about 40 parts by weight, the flexibility, the storage stability of the ink and the like tend to deteriorate, and conversely when it is less than about 10 parts by weight, the curing properties and the like tend to deteriorate. The amount of the diisocyanate is in excess of the above-mentioned composition ratio and more than about 40 parts by weight, the curing properties and the like tend to deteriorate, and conversely when it is less than about 10 parts by weight, the storage stability of the ink and the like are liable to deteriorate.

The novolac type epoxy resin which is used in the present invention includes cresol novolac type epoxy resins, phenol novolac type epoxy resins and halogenated epoxy resins thereof having flame retardance. Typical examples of the novolac type epoxy resin include DEN 438 (trade name, made by Dow Chemical Co.), EOCN-1025 and BREN-S (trade names, made by Nippon Kayaku Co., Ltd.) and YDPN-638 (trade name, made by Totokasei Co., Ltd.).

The amount of the novolac type epoxy resin is from about 30 to about 300 parts by weight, preferably about 40 to about 150 parts by weight with respect to 100 parts by weight of the copolymer. When the amount of the novolac type epoxy resin is more than about 300 parts by weight, the flexibility is likely to be impaired and the FPC on which a cover layer film is formed tends to curl. Conversely, when the amount of the novolac type epoxy resin is less than about 30 parts by weight, heat resistance and chemical resistance are likely to be impaired.

Examples of a bisphenol type epoxy resin which is used in the present invention include bisphenol A type epoxy resins, bisphenol F type epoxy resins and halogenated epoxy resins thereof having flame retardance. Typical examples of the bisphenol type epoxy resin include Epicoat 1007 and Epicoat 1010 (trade names, made by Yuka-Shell Epoxy Co., Ltd.), DER 669 (trade name, made by Dow Chemical Co.), and YD-020 and YDF-2007 (trade names, made by Totokasei Co., Ltd.).

The amount of the bisphenol type epoxy resin is about 30 to about 300 parts by weight, preferably about 40 to about 150 parts by weight with respect to 100 parts by weight of the copolymer. When the amount of the bisphenol type epoxy resin is more than about 300 parts by weight, a crosslinking density declines, which might have a bad influence on the chemical resistance. Conversely when it is less than about 30 parts by weight, a phase separation is incomplete and the FPC on which the cover layer film is formed tends to curl.

With regard to a blend ratio of the epoxy resin to the copolymer comprising the PC, the diamine and the diisocyanate which are used in the present invention, if the amount of the epoxy resin is more than about 1,000 parts by weight with respect to about 100 parts by weight of the copolymer, the crosslinking density of the cured material increases excessively, so that the flexibility deteriorates and the FPC on which the cover layer film is formed tends to curl. Conversely, if the amount of the epoxy resin is less than about 10 parts by weight, the crosslinking is poor, so that the heat resistance and the chemical resistance are likely to decline.

With regard to a blend ratio of the novolac type epoxy resin to the bisphenol type epoxy resin which are used in the present invention, if the amount of the bisphenol type epoxy resin is more than about 5,000 parts by weight with respect to about 100 parts by weight of the novolac type epoxy resin, the crosslinking density lowers excessively and so solvent resistance is poor. Conversely, if it is less than about 12.5 parts by weight, the crosslinking density rises excessively, so that the phase separation is incomplete and the FPC on which the cover layer film is formed tends to curl.

Examples of a thixotropic agent which can be used in the present invention include fine powders such as silica and alumina, materials having thixotropic properties which are each obtained by heating a benzylidene sorbitol, an epoxy resin or its solution, or by treating it with a curing agent or the like so as to partially crosslink it, and materials having thixotropic properties which are each obtained from polyamic acid or its solution by a means such as heating so as to partially imidate it. Typical examples of the thixotropic agent include standard products, which have not been subjected to a surface treatment, such as Aerosyl 200 and Aerosyl 300 (trade names, made by Nippon Aerosyl Co., Ltd.), crude products, which have been subjected to the surface treatment, such as Aerosyl R972 and RY200 (trade names, made by Nippon Aerosyl Co., Ltd.) as the fine silica powders, and Aluminum Oxide C (trade name, made by Nippon Aerosyl Co., Ltd.) as a fine alumina powder.

The amount of the thixotropic agent is from about 0.2 to about 20 parts by weight, preferably about 0.5 to about 15 parts by weight with respect to 100 parts by weight of the copolymer. When the amount of the thixotropic agent is more than about 20 parts by weight, the viscosity and the thixotropic properties of the obtained ink composition are excessive, so that the trace of a screen mesh remains on the coating film after the printing and the surface of the coating film is noticeably coarse. In addition, the ink cannot be passed through the screen mesh and the printing is impossible at times. Moreover, the flexibility of the obtained coating film is also poor. When the amount of the thixotropic agent is less than about 0.2 part by weight, the thixotropic ratio is too low and ink dangles occur after the printing, so that it is difficult to form a precise pattern.

Examples of a defoaming agent which can be used in the present invention include silicon compounds and acrylic compounds. Typical examples of the defoaming agent include #580 (trade name, made by Toyo Ink Co., Ltd.), KS-603 (trade name, made by Shinetsu Silicone Co., Ltd.), and DB-100, O C-2 and FS-1265 (trade names, made by Dow Corning Co., Ltd.).

The amount of the defoaming agent should be adjusted so as to obtain the practicable composition, and it is usually from about 0.1 to about 30 parts by weight, preferably about 0.5 to about 20 parts by weight with respect to 100 parts by weight of the copolymer. When the amount of the defoaming agent is more than about 30 parts by weight, the defoaming agent oozes out on the surface of the coating film and shows a sticky state, and the adhesion between the coating film and the base material deteriorates. In addition, repellency is likely to occur on the surface to be printed, and the defoaming agent might be inconveniently separated from the resin and a non-uniform state tends to appear. When the amount of the defoaming agent is less than about 0.1 part by weight, a large amount of the foam is likely to be formed at the time of the printing. One kind of foam does not vanish and another kind of foam vanishes, while it is allowed to stand. However, when a long standing time is required, the operation efficiency is lowered significantly, and pinholes are likely to be formed on the surface after the drying and curing, so that the coating film tends to have a nonuniform thickness.

Preferable examples of a leveling agent which is used in the present invention include silicon compounds. Typical examples include FZ-2110 and L-7001 (trade names, made by Nippon Unicar Co., Ltd.), KS607A (trade names, made by Shinetsu Silicon Co., Ltd.) and Paintad (57, Q, S and the like) (trade names, made by Dow Corning Co., Ltd.).

The amount of the leveling agent should be adjusted so as to obtain a practicable composition, and it is usually from about 0.1 to about 10 parts by weight with respect to 100 parts by weight of the copolymer. When the amount of the leveling agent is more than about 10 parts by weight, the defoaming agent oozes out on the surface of the coating film and shows a sticky state, and the adhesion of the coating film to the base material deteriorates. In addition, repellency is likely to occur on the surface to be printed, and the leveling agent might be inconveniently separated from the resin and nonuniformed state tends to appear. When the amount of the leveling agent is less than about 0.1 part by weight, a rough surface of the coating film attributed to the remainder of the foam generated at the time of the printing and the screen mesh is not sufficiently leveled, and pinholes are likely to be formed on the surface after drying and curing, so that the film tends to have a nonuniform thickness.

For the adjustment of viscosity, an organic solvent can be added to the ink composition of the present invention. Examples of the organic solvent include ketone solvents such as ethyl methyl ketone and acetone; ester solvents such as ethyl acetoacetate, γ-butyrolactone and butyl acetate; alcohol solvents such as butanol and benzyl alcohol; solvents of Cellosolve series, Carbitol series, their ester and ether derivatives; amide solvents such as N,N-dimethylformamide and N-methyl-2-pyrrolidone; dimethyl sulfoxide; phenol solvents such as phenol and cresol; nitro compound solvents; chlorinated hydrocarbon solvents such as chloroform and methylene chloride; aromatic solvents such as toluene and xylene; and aliphatic solvents such as heptane and cyclohexane. They can be used singly or in a combination of two or more kinds thereof. The amount of the organic solvent is preferably adjusted so that the viscosity of the ink composition may be from 500 to 500,000 centipoise. More specifically, the amount of the organic solvent is from 0 to 4 times by weight, preferably 0 to 1 times by weight as much as that of components other than organic solvents such as the above-mentioned copolymer, epoxy resin, thixotropic agent, defoaming agent and leveling agent and the undermentioned curing catalyst for the epoxy resin (when this is added). When the amount of the organic solvent is in excess of the above-mentioned range, that is to say, when it is in excess of 4 times by weight, the concentration of the solid content lowers. In consequence, when the composition containing the organic solvent at such a high concentration is used as an ink for the printing, the sufficient thickness of a coating film cannot be obtained by one printing operation, and thus many printing operations might be inconveniently required on occasion.

A curing catalyst for the epoxy resin can be used in the ink composition of the present invention. This curing catalyst is required to have a storage stability as a one-pack type composition, and so it preferably is a latent curing catalyst in which its activity is low at ordinary temperature and is high at the time of the heating/curing. Typical examples of the curing catalyst include boron trifluoride amine complex salts and dicyanamides. The amount of this kind of curing catalyst, when used, is 0.1% by weight or more, preferably 0.3% by weight or more, more preferably 1% by weight or more and 80% by weight or less, preferably 50% by weight or less, more preferably 10% by weight or less with respect to the weight of the above-mentioned epoxy resin.

The ink composition for the printing of present invention is an ink obtained from the abovementioned copolymer comprising the PC, the diamine and the diisocyanate, the novolac type epoxy resin, the bisphenol type epoxy resin, the thixotropic agent, the leveling agent, the organic solvent, the curing catalyst and the like in a usual manner by the use of an ink mill such as a three-roll mill. The thus obtained ink composition is a one-pack type ink composition having good storage stability.

With regard to the usage of the ink composition for printing of the present invention, the ink composition for printing is first applied onto circuit boards by screen printing or mask printing. Next, the resultant coating films are dried at a temperature of 100° to 150° C. for a period of 0 to 60 minutes in a hot-air drying furnace, and further heated and cured at 150° to 200° C. for 5 to 60 minutes.

The ink composition for printing of the present invention is a one-pack type ink composition which is excellent in storage stability, heat resistance, adhesive properties, flexibility, electrical properties, chemical resistance and printability, and when the ink composition is applied to FPC boards in a manner such as screen printing, coating films having high reliability can be formed with ease. Therefore, a complex operation such as the application of cover films is not required any more, which can improve production efficiency. In addition, only, the operations of printing and hot drying are needed, and thus an expensive machine such as a roll press is unnecessary.

Furthermore, in the ink composition of the present invention, highly concentrating the same and curing it at a low temperature are possible, which cannot be achieved at all by a conventional polyimide varnish-based ink composition for printing. Accordingly, the coating film having a sufficient thickness can be obtained even by one printing operation on the boards. The selection of suitable printing conditions permits easily printing the thicker coating film. In the present invention, a conventional curing furnace which has been used heretofore to cure solder resists can be sufficiently utilized.

Furthermore, when a phase separation is carried out by adjusting a composition ratio between the two kinds of epoxy resins, the FPC boards obtained with the coating films do not curl, and even if heat history is given to the cured coating films, the boards do not curl. Consequently, in the present invention, the employment of a severe soldering technique such as float soldering is possible in which heat extends all over the boards.

EXAMPLES

Next, the present invention will be described in detail in accordance with reference examples regarding the synthesis of a copolymer comprising a PC, a diamine and a diisocyanate and examples of the present invention together with comparative examples. However, the scope of the present invention should not be construed as being limited to these examples. In the preparation example, the examples and the comparative examples, "part" and "parts" mean part by weight and parts by weight, respectively, unless otherwise specified.

The copolymer comprising the PC, the diamine and the diisocyanate which would be used in the examples was prepared as follows:

A reaction vessel was used which was equipped with a stirring rod, a condenser, a dropping device, a nitrogen blower and a thermometer.

The reaction vessel was heated up to 50° C., followed by nitrogen substitution. Afterward, 10 parts by weight of diphenylmethane diisocyanate and 25 parts of a polycaprolactonediol having an average molecular weight of 1250 were added thereto, and reaction was then carried out at 80° C. for 4 hours in a nitrogen atmosphere, while the contents were stirred. After completion of the reaction, the solution was cooled to 50√ C.

A solution of 9.95 parts of 4,4'-diaminodiphenylsulfone in 30 parts of dimethylformamide was added to the resultant reaction product, and reaction was then carried out at 50° C. for 2 hours under a nitrogen atmosphere, while the solution was stirred. After the reaction, the solution was cooled to room temperature to obtain a copolymer solution containing 60% by weight of a copolymer solid content.

Examples 1 to 5, Comparative Examples 1 and 2

The above-mentioned polymer solution, a novolac type epoxy resin (trade name DEN-438, made by Dow Chemical Co.), a bisphenol type epoxy resin (trade name Epicoat 1010, made by Yuka-Shell Epoxy Co., Ltd.), a thixotropic agent (trade name Aerosyl 300, made by Nippon Aerosyl Co., Ltd.), a defoaming agent (trade name DB-100, made by Dow Corning Co., Ltd.) and a leveling agent (trade name Paintad 57, made by Dow Corning Co., Ltd.) were mixed in each ratio shown in Table 1 and then kneaded three times by a three-roll mill to obtain a pasty ink composition for printing. Table 2 shows solid content concentrations, rotational viscosities [E type viscometer: the results measured at 25° C. at 0.5 rpm and 5 rpm under conditions of rotor 3°×R14 (the same shall apply hereinafter)], thixotropic ratios [viscosity (0.5 rpm)/viscosity (5 rpm)] and storage stability (the ink compositions were stored at room temperature for 6 months, and when thickening and gelation attributed to the polymerization and the separation of the additives were not observed in the ink compositions, these compositions were judged to be good) of these ink compositions.

Comparative Example 3

100 parts of a urethane-modified epoxy resin (trade name EPU-6, made by Asahi Denka Kogyo K.K.), 5 parts of $BF_3$-monoethyl amine complex, 5 parts of a thixotropic agent (trade name Aerosyl 300, made by Nippon Aerosyl Co., Ltd.), 1 part of a defoaming agent (trade name DB-100, made by Dow Corning Co., Ltd.) and 0.2 part of a leveling agent (trade name Paintad 57, made by Dow Corning Co., Ltd.) were mixed and then kneaded three times by a three-roll mill to obtain a pasty ink composition for printing. Table 2 shows solid content concentrations, rotational viscosities, thixotropic ratios [viscosity (0.5 rpm)/viscosity (5 rpm)] and storage stability (the ink compositions were stored at room temperature for 6 months, and when thickening and gelation attributed to the polymerization and the separation of the additives were not observed in the ink compositions, these compositions were judged to be good) of the obtained ink compositions.

TABLE 1

|  | Copolymer*1) | Blend Concentration (parts) | | | | |
|---|---|---|---|---|---|---|
|  |  | Novolac Epoxy | Bisphenol Type Epoxy | Thixotropic Agent | Defoaming Agent | Leveling Agent |
| Example 1 | 73 | 6.45 | 32.25 | 1.1 | 4.0 | 1.2 |
| Example 2 | 73 | 12.90 | 25.80 | 1.1 | 4.0 | 1.2 |
| Example 3 | 73 | 19.35 | 19.35 | 1.1 | 4.0 | 1.2 |
| Example 4 | 73 | 25.80 | 12.90 | 1.1 | 4.0 | 1.2 |
| Example 5 | 73 | 32.25 | 6.45 | 1.1 | 4.0 | 1.2 |
| Comp. Ex. 1 | 73 | 0 | 38.70 | 1.1 | 4.0 | 1.2 |
| Comp. Ex. 2 | 73 | 38.70 | 0 | 1.1 | 4.0 | 1.2 |
| Comp. Ex. 3 | With regard to blend concentration, refer to the text. | | | | | |

*1)Copolymer (solid content concentration 60% by weight).

TABLE 2

|  | Solid Content Conc. (wt %) | Viscosity 0.5 rpm (cp) | Viscosity 5 rpm (cp) | Thixotropic Ratio [viscosity (0.5 rpm)/ viscosity (5 rpm)] | Storage Stability |
|---|---|---|---|---|---|
| Example 1 | 75 | 35,300 | 9,000 | 3.9 | Good |
| Example 2 | 75 | 32,400 | 8,500 | 3.8 | Good |
| Example 3 | 75 | 28,000 | 7,400 | 3.8 | Good |
| Example 4 | 75 | 25,000 | 7,000 | 3.6 | Good |
| Example 5 | 75 | 25,000 | 6,800 | 3.7 | Good |
| Comp. Ex. 1 | 75 | 38,000 | 9,400 | 4.0 | Good |
| Comp. Ex. 2 | 75 | 23,500 | 6,600 | 3.6 | Good |
| Comp. Ex. 3 | 100 | 40,000 | 5,000 | 8.0 | Good |

Printing was carried out on flexible copper-clad plates (the thickness of a polyimide base 60 μm) in a screen printing method by the use of these ink compositions and a screen of 200 mesh. Afterward, the ink compositions were subjected to a heat treatment at 140° C. for 5 minutes and then at 180° C. for 15 minutes. Tables 3 and 4 show printing properties of the resultant coating film patterns (running width, pattern precision, surface smoothness and operability), the curl state of the flexible copper-clad plates with the coating films, and the thickness of the coating films.

TABLE 3

|  | Printing Characteristics | | | |
|---|---|---|---|---|
|  | Running width (μm) | Pattern Precision (μm) | Surface Smoothness (visual) | Workability |
| Example 1 | <100 | <200 | Good | Good |
| Example 2 | <100 | <200 | Good | Good |
| Example 3 | <100 | <200 | Good | Good |
| Example 4 | <100 | <200 | Good | Good |

TABLE 3-continued

|  | Printing Characteristics | | | |
|---|---|---|---|---|
|  | Running width (μm) | Pattern Precision (μm) | Surface Smoothness (visual) | Workability |
| Example 5 | <100 | <200 | Good | Good |
| Comp. Ex. 1 | <100 | <200 | Good | Good |
| Comp. Ex. 2 | <100 | <200 | Good | Good |
| Comp. Ex. 3 | <100 | <200 | Good | Good |

TABLE 4

|  | Curing Properties of Flexible Copper-clad Plate with Coating Film | | Thickness of Coating Film (μm) |
|---|---|---|---|
|  | Ordinary State | After Soldering Treatment |  |
| Example 1 | Good | Good | 27 |
| Example 2 | Good | Good | 27 |
| Example 3 | Good | Good | 26 |
| Example 4 | Good | Good | 26 |
| Example 5 | Good | Good | 26 |
| Comp. Ex. 1 | Good | Good | 26 |
| Comp. Ex. 2 | Bad | Bad | 25 |
| Comp. Ex. 3 | Good | Bad | 35 |

The running width in Table 3 means the edge width of each pattern which flows until cured after the printing.

The pattern precision is represented by the absolute value of a difference between the pattern width of a screen mask and the pattern width of the ink after the printing and curing.

The surface smoothness was evaluated by visually observing the surface of each coating film after the printing and curing. With regard to the evauation, when both defoaming properties and leveling properties of each ink composition were good, the ink composition was judged to be "good", and when either or both of these items were not good, it was judged to be "bad".

With regard to the evaluation of the curling properties of the boards formed with the coating films, a curl diameter of each of the produced flexible copperclad plates with the coating films was measured, and when the curl diameter was 10 cm or more, the flexible copper-clad plate was judged to be "good", and when the curl diameter was 10 cm or less, it is judged to be "bad". In this table, the "ordinary state" means the intact state of the flexible copper-clad plates with the coating films after the curing, and values in the column of the ordinary state were values measured in the ordinary state. Furthermore, "after soldering treatment" means "after the cured flexible copper-clad plates were allowed to float in a soldering bath at 280° C. for 60 seconds", and values in the column of the "after soldering treatment" were values measured after the above-mentioned floating.

"Workability was good" means a state where foams, repellency, oozing, scratching and threading of the ink did not take place in the printing step.

Moreover, characteristics of the obtained flexible copper-clad plates with the coating films, particularly flexibility, heat resistance and electrical properties were inspected. The results are set forth in Table 5.

TABLE 5

|  | Flexibility (Times) | Heat Resistance | Adhesive Properties | Electrical Properties ($\Omega$) | Chemical Resistance |
| --- | --- | --- | --- | --- | --- |
| Example 1 | 1.5 | Good | 10 | $2 \times 10^{12}$ | Good |
| Example 2 | 1.6 | Good | 10 | $2 \times 10^{12}$ | Good |
| Example 3 | 1.6 | Good | 10 | $3 \times 10^{12}$ | Good |
| Example 4 | 1.6 | Good | 10 | $3 \times 10^{12}$ | Good |
| Example 5 | 1.5 | Good | 10 | $4 \times 10^{12}$ | Good |
| Comp. Ex. 1 | 1.3 | Good | 10 | $1 \times 10^{12}$ | Bad |
| Comp. Ex. 2 | 1.4 | Good | 10 | $4 \times 10^{12}$ | Good |
| Comp. Ex. 3 | 1.2 | Bad | 10 | $3 \times 10^{12}$ | Bad |

In this connection, the above-mentioned flexibility was represented by a ratio of the fold number of the flexible copper-clad plates with the coating films until they were broken to the fold number of the flexible copper-clad plates without the coating films until they were broken, and this ratio means how the folding resistance of the flexible copper-clad plates was improved. The fold number was counted until the electricity conduction through a circuit was cut by folding the flexible copper-clad plates under conditions of a flexing rate of 180 times/minute, a tension of 500 gf, a curvature radius of 0.38 mm and a folding angle of 135° (270° in both ways) by the use of an MIT flexing test machine. In the conductive patterns of the flexible copper-clad plates (polyimide base thickness 60 $\mu$m) without the coating films used, returnable conductors having a width of 1.5 mm were formed at an interval of 1.0 mm by etching. In the used conductive patterns of the flexible copper-clad plates with the coating films used, cover coating films were formed on the conductive patterns of the flexible copper-clad plates without the coating films. The heat resistance was judged by visually observing the peeling, blisters and discoloration of the coating films when the samples were allowed to float in a soldering bath at 280° C. for 60 seconds, and the samples in which no change was observed after the test were judged to be good, and the samples in which some change was observed after the test were judged to be bad.

The adhesive properties were evaluated on the basis of JIS K5400 in accordance with Nippon Toso Gijutsu Kyokai (Japanese Coating Technology Institute). That is, a 1 mm $\times$ 1 mm section of each sample was divided by longitudinal and transverse lines at intervals of 1 mm, and the coating film was only cut along these lines by a cutter knife so that 100 of 1 mm $\times$ 1 mm small sections might be formed and so that the base material might not be cut off. A cellophane adhesive tape was stuck on the cut coating film and then pulled up at an angle of 90°, and the peeled small sections having a size of 1 mm $\times$ 1 mm were counted. The adhesive properties were evaluated by the number of the peeled small sections. The sample where no small sections were either peeled or broken was judged to have a perfect score of 100.

The electrical properties were evaluated on the basis of JIS C6481. That is, the sample was etched to form parallel lines having a total length of 80 mm at an interval of 1.0 mm, and a voltage of DC 100 V was then applied to the sample and a line-to-line insulation resistance was measured after one minute. The electrical properties were evaluated from the measured line-to-line insulation resistance.

The chemical resistance was evaluated as follows: Each sample was immersed in each of methylene chloride, methyl ethyl ketone, a 0.1% HCl aqueous solution and a 10% NaOH aqueous solution at room temperature for 24 hours, and the peeling, blisters and dissolution of the coating film were visually observed. The sample which could withstand all of these chemicals was judged to be good.

In the above-mentioned Tables 3, 4 and 5, the inks described in the examples are all excellent in all of physical properties, but the ink of Comparative Example 1 is poor in chemical resistance. Furthermore, the ink of Comparative Example 2 is poor in curling properties, and the ink of Comparative Example 3 is poor in curling properties after the soldering treatment, heat resistance and chemical resistance.

What is claimed is:

1. A flexible printed circuit board screen printing ink composition which comprises a blend of 100 parts by weight of a copolymer comprising a polycaprolactonepolyol, a diamine and a diisocyanate; about 30 to about 300 parts by weight of a novolac epoxy resin; about 30 to about 300 parts by weight of a bisphenol epoxy resin; about 0.2 to about 20 parts by weight of a thixotropic agent; about 0.1 to about 30 parts by weight of a defoaming agent; and about 0.1 to about 10 parts by weight of a leveling agent.

2. The ink composition according to claim 1 wherein the copolymer comprising the polycaprolactonepolyol, the diamine and the diisocyanate is a copolymer obtained by polymerizing about 20 to about 80 parts by weight of the polycaprolactonepolyol, about 10 to about 40 parts by weight of the diamine, and about 10 to about 40 parts by weight of the diisocyanate.

3. The ink composition according to claim 1 wherein the bisphenol epoxy resin is blended in an amount of about 12.5 to about 5,000 parts by weight with respect to 100 parts by weight of the novolac epoxy resin.

4. The ink composition according to claim 1 wherein an epoxy equivalent of the bisphenol epoxy resin is in the range of 1,000 to 10,000.

5. The ink composition according to claim 1, further including a viscosity adjusting solvent in an amount by weight of up to 4 times the total weight of the other components.

6. The ink composition according to claim 1, further including a curing catalyst in an amount of about 0.1 to about 80% by weight, based on the weight of the epoxy resins.

7. The ink composition according to claim 6 wherein said curing catalyst is a latent curing catalyst.

8. The ink composition according to claim 1 wherein the concentration of said thixotropic agent is about 0.5 to about 15 parts by weight, based on 100 parts by weight of said copolymer.

9. The ink composition according to claim 1 wherein the concentration of said defoaming agent is about 0.5 to about 20 parts by weight, based on 100 parts by weight of said copolymer.

10. The ink composition according to claim 1 wherein said polycaprolactonepolyol is polycaprolactonediol.

11. The ink composition according to claim 1 wherein said diamine is 4,4'-diaminodiphenylsulfone.

12. The ink composition according to claim 1 wherein said diisocyanate is diphenylmethane diisocyanate.

13. The ink composition according to claim 5 wherein said solvent is dimethylformamide.

14. An ink composition for printing which includes a blend of 100 parts by weight of a copolymer derived from polycaprolactonediol, 4,4'-diaminodiphenylsulfone and diphenylmethane diisocyanate; about 30 to about 300 parts by weight of a novolac epoxy resin; about 30 to about 300 parts by weight of a bisphenol epoxy resin; about 0.5 to about 20 parts by weight of a thixotropic agent; about 0.5 to about 20 parts by weight of a defoaming agent; about 0.1 to about 10 parts by weight of a leveling agent; up to 80% of the weight of the epoxy resins of a latent curing catalyst and up to about 4 times the total weight of the aforementioned components of dimethyl formamide.

* * * * *

UNITED STATES PATENT AND TRADEMARK OFFICE
CERTIFICATE OF CORRECTION

PATENT NO. : 5,380,806
DATED : January 10, 1995
INVENTOR(S) : Hitoshi Yano

It is certified that error appears in the above-indentified patent and that said Letters Patent is hereby corrected as shown below:

Column 14, line 11, delete "for printing".

Signed and Sealed this

Twenty-third Day of May, 1995

Attest:

BRUCE LEHMAN

Attesting Officer     *Commissioner of Patents and Trademarks*